(12) United States Patent
Wang et al.

(10) Patent No.: US 9,786,556 B2
(45) Date of Patent: Oct. 10, 2017

(54) SEMICONDUCTOR DEVICE AND METHOD OF MANUFACTURING THE SEMICONDUCTOR DEVICE

(71) Applicant: Toshiba Memory Corporation, Minato-ku (JP)

(72) Inventors: Weiting Wang, Kawasaki (JP); Fumiharu Nakajima, Yokohama (JP); Yoko Yokoyama, Minato-ku (JP); Sadatoshi Murakami, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/409,742

(22) Filed: Jan. 19, 2017

(65) Prior Publication Data

US 2017/0133267 A1   May 11, 2017

Related U.S. Application Data

(62) Division of application No. 14/632,269, filed on Feb. 26, 2015, now Pat. No. 9,646,982.

(Continued)

(51) Int. Cl.
*H01L 21/033* (2006.01)
*H01L 21/768* (2006.01)
(Continued)

(52) U.S. Cl.
CPC .. *H01L 21/76892* (2013.01); *H01L 21/31111* (2013.01); *H01L 21/31116* (2013.01);
(Continued)

(58) Field of Classification Search
None
See application file for complete search history.

(56) References Cited

U.S. PATENT DOCUMENTS 6,649,945 B1   11/2003   Hosono et al.
6,995,410 B2    2/2006   Hosono et al.
(Continued)

FOREIGN PATENT DOCUMENTS

JP   2004-079857 A   3/2004
JP   2010-153869 A   7/2010
(Continued)

*Primary Examiner* — Ali Naraghi
(74) *Attorney, Agent, or Firm* — Oblon, McClelland, Maier & Neustadt, L.L.P.

(57) ABSTRACT

According to an embodiment, a manufacturing method of a semiconductor device includes forming, on a film to be processed, a plurality of first core material patterns and a plurality of second core material patterns. Each of the second core material patterns is drawn from an end portion of the corresponding first core material pattern. The manufacturing method includes forming an opening pattern having one or a plurality of openings in the second core material pattern so that a first distance and a second distance are less than a predetermined distance. The first distance is a distance between an edge of the second core material pattern at a side of an adjacent first core material pattern and the opening pattern. The second distance is a distance between an edge of the second core material pattern at a side of an adjacent second core material pattern and the opening pattern.

11 Claims, 15 Drawing Sheets

Related U.S. Application Data

(60) Provisional application No. 62/047,717, filed on Sep. 9, 2014.

(51) Int. Cl.
*H01L 21/311* (2006.01)
*H01L 23/528* (2006.01)
*H01L 21/02* (2006.01)

(52) U.S. Cl.
CPC .. *H01L 21/31144* (2013.01); *H01L 21/76816* (2013.01); *H01L 23/528* (2013.01); *H01L 21/0217* (2013.01); *H01L 21/02164* (2013.01); *H01L 21/02271* (2013.01)

(56) References Cited

U.S. PATENT DOCUMENTS

| | | | |
|---|---|---|---|
| 8,310,055 B2 | 11/2012 | Park et al. | |
| 8,629,052 B2 | 1/2014 | Park et al. | |
| 8,785,327 B2* | 7/2014 | Kikutani | H01L 27/11573 438/618 |
| 9,224,635 B2* | 12/2015 | Pellizzer | H01L 21/768 |
| 2004/0079970 A1 | 4/2004 | Hosono et al. | |
| 2010/0155959 A1 | 6/2010 | Park et al. | |
| 2011/0151668 A1* | 6/2011 | Tang | H01L 21/0337 438/671 |
| 2012/0241834 A1* | 9/2012 | Nakajima | H01L 21/0337 257/316 |
| 2013/0040452 A1 | 2/2013 | Park et al. | |
| 2013/0082388 A1 | 4/2013 | Matsuda | |
| 2014/0264893 A1* | 9/2014 | Pratt | H01L 23/528 257/773 |
| 2015/0021790 A1 | 1/2015 | Nagashima et al. | |
| 2015/0243598 A1* | 8/2015 | Zhong | H01L 21/76892 257/773 |

FOREIGN PATENT DOCUMENTS

| | | |
|---|---|---|
| JP | 2011-119536 A | 6/2011 |
| JP | 2013-084926 A | 5/2013 |
| JP | 2015-023225 A | 2/2015 |

* cited by examiner

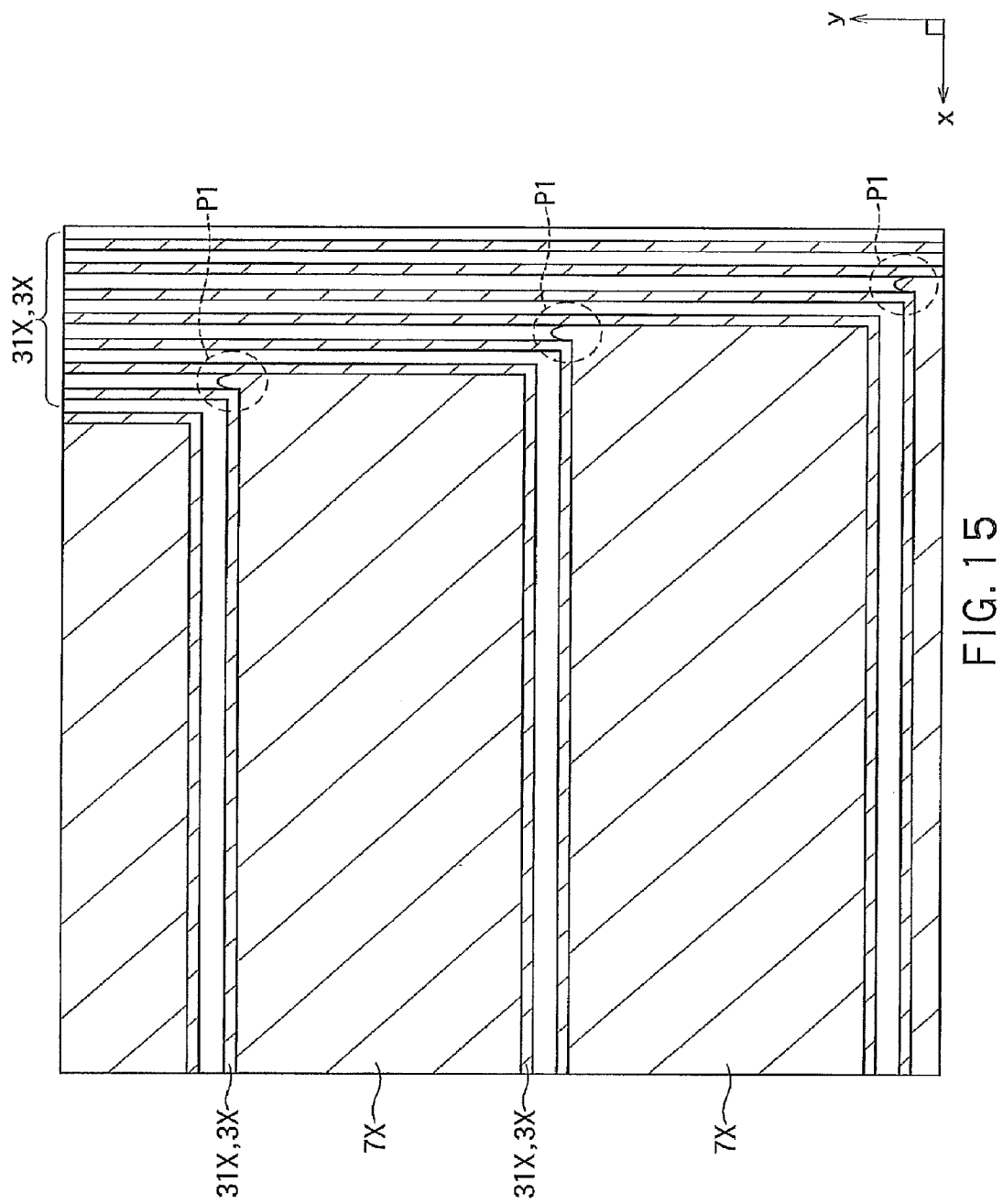

SEMICONDUCTOR DEVICE AND METHOD OF MANUFACTURING THE SEMICONDUCTOR DEVICE

CROSS REFERENCE TO RELATED APPLICATIONS

This application is a division of and claims the benefit of priority under 35 U.S.C. §120 from U.S. Ser. No. 14/632,269 filed Feb. 26, 2015, and claims the benefit of priority from U.S. Provisional Patent Application No. 62/047,717 filed Sep. 9, 2014, the entire contents of each of which are incorporated herein by reference.

FIELD

Embodiments described herein relate generally to a semiconductor device and a method of manufacturing the semiconductor device.

BACKGROUND

As the size of a semiconductor device is reduced, it is required to form a wire pattern finer than the critical dimension of a resolution of lithography. A side wall transfer technique is known as one of such techniques for forming a fine wire pattern.

An end portion of a wire formed according to the side wall transfer technique is connected to a wire and the like of another layer, and therefore, it is necessary to provide a pad wider than the width of the wire. Such pad cannot be formed by only the side wall transfer technique. A technique for adding cover process for forming the pad is known.

The cover process is a process that includes forming a side wall pattern along an external periphery of a core material, thereafter covering, with a mask, a core material for a pad in an area where the pad is formed, and leaving the core material for the pad when the core material in the area where the wire is formed is removed. Thereafter, during etching, the core material for the pad serves as a mask, and a wide pad can be formed.

BRIEF DESCRIPTION OF THE DRAWINGS

FIG. 15 is a top view illustrating a pattern of a film to be processed after an etching is performed using a side wall pattern as a mask according to a comparative example.

DETAILED DESCRIPTION

Figure 1:
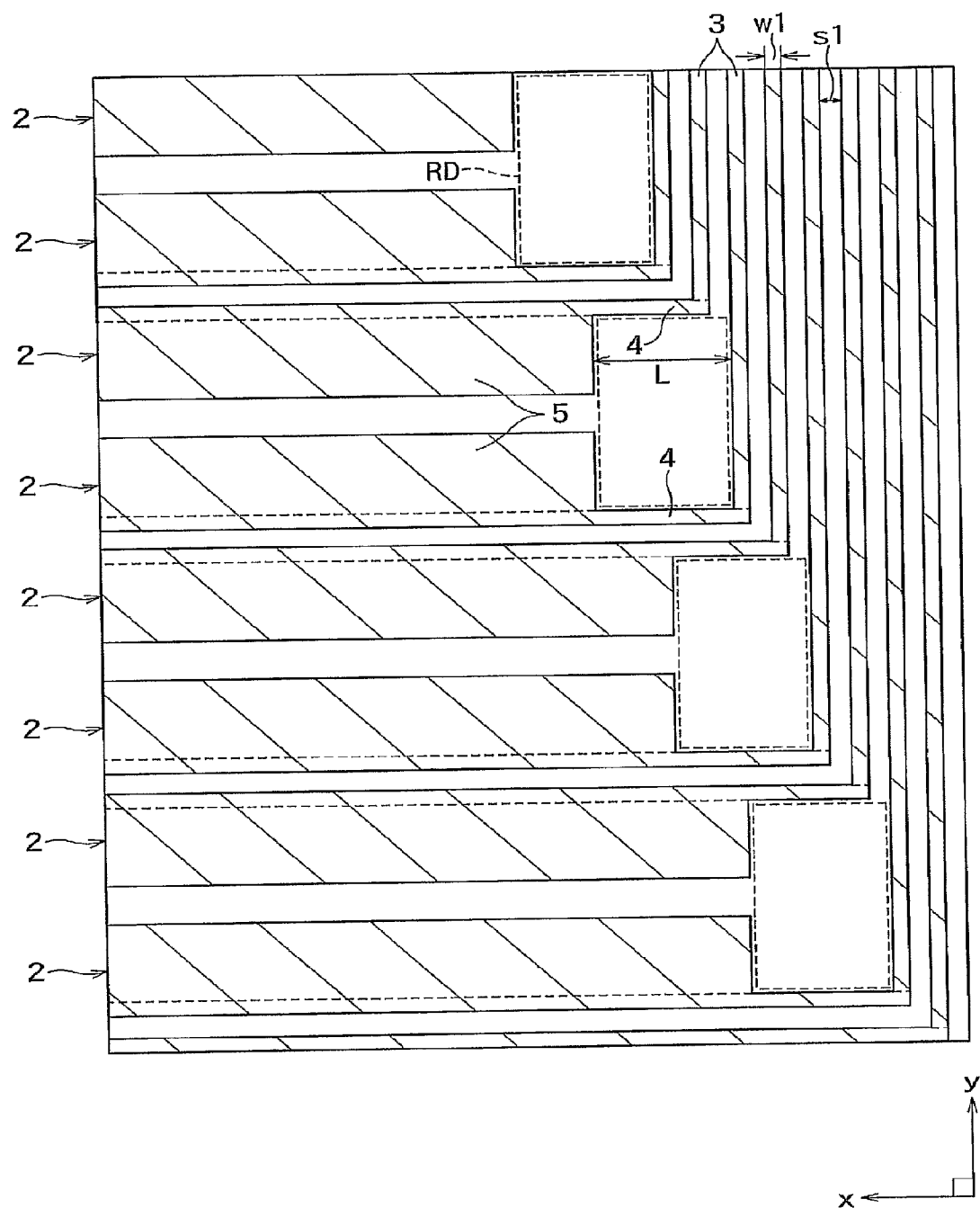
FIG. 1 is a top view for explaining a manufacturing step for manufacturing a semiconductor device according to a first embodiment.

According to an embodiment, a manufacturing method of a semiconductor device includes forming, on a film to be processed, a plurality of first core material patterns extending in parallel in a first direction, and a plurality of second core material patterns. Each of the second core material patterns is drawn from an end portion of the corresponding first core material pattern. The second core material patterns extend in parallel in a second direction crossing the first direction. A width of the second core material pattern is wider than a width of the first core material pattern. The manufacturing method includes forming an opening pattern having one or a plurality of openings in the second core material pattern so that a first distance and a second distance are less than a predetermined distance. The first distance is a distance between an edge of the second core material pattern at a side of an adjacent first core material pattern and the opening pattern. The second distance is a distance between an edge of the second core material pattern at a side of an adjacent second core material pattern and the opening pattern. The manufacturing method includes forming a first side wall pattern along external peripheries of the first core material pattern and the second core material pattern and along an inner periphery of the opening. The manufacturing method includes removing the first core material pattern and the second core material pattern after forming the first side wall pattern. The manufacturing method includes etching the film after removing the first and second core material patterns.

Before explaining the first embodiment, a manufacturing method for manufacturing a semiconductor device according to a comparative example known by the inventors of the present application will be explained.

The inventors of the present application have found that when the etching condition is adjusted, not only a pattern of a width of a side wall pattern but also a pattern of a wider width than the width of the side wall pattern can be formed according to the side wall transfer technique. More specifically, it is not necessary to use the cover process.

FIG. 15 is a top view illustrating a pattern of a film to be processed after the etching is performed using the side wall pattern as a mask according to the comparative example.

First, according to the side wall transfer technique, for example, a side wall pattern 31X is formed on the film to be processed. The side wall pattern 31X includes a portion in which a pattern is dense where the pattern interval is less than 100 nm and a portion in which a pattern is coarse where the pattern interval is equal to or more than 100 nm.

Thereafter, by making use of loading effect, anisotropic etching is applied to the film to be processed, in such a manner that the etching speed is faster in the portion where the pattern is dense, and the etching speed is slower in the portion where the pattern is coarse.

As a result, as shown in FIG. 15, a wire 3X of the film to be processed is formed below the linear side wall pattern 31X. Because of the lower etching speed, a pad pattern 7X of the film to be processed of which width is wider than the wire 3X is formed between a pair of linear side wall patterns 31X, 31X extending in a second direction x. Due to such manufacturing process, a pair of wires 3X, 3X is connected by the pad pattern 7X, and is integrated.

Therefore, thereafter, it is necessary to make two pads separated from each other by cutting the pad pattern 7X along the second direction x by etching and the like. However, a connection portion P1 between the pair of wires 3X, 3X and the end portion of the pad pattern 7X has the narrowest width in the pad pattern 7X, and is narrower than the limitation dimension of the resolution of the lithography. Therefore, using the lithography, it is difficult to cut the pad pattern 7X but not to cut the wire 3X. Therefore, the reliability of the manufacturing process is reduced.

First Embodiment

FIGS. 1 to 6 are top views for explaining manufacturing steps for manufacturing a semiconductor device according to the first embodiment. FIGS. 1 to 6 enlarge and show the same area of the semiconductor device.

First, as shown in FIG. 1, the shapes of the wire patterns 2 are designed. In the explanation about the present embodiment, for example, the wire pattern 2 as shown in FIG. 1 is formed by repeating the side wall transfer process twice. As explained later with reference to FIG. 6, a dummy pattern is also formed ultimately in a dummy area RD of FIG. 1 in order to form the wire pattern 2 as shown in FIG. 1.

Each wire pattern 2 includes a wire 3, a leading line 4, and a pad 5. A pair of adjacent wire patterns 2, 2 is used as a basic pattern, and multiple pairs of wire patterns 2, 2 are provided.

A pair of wires 3, 3 extends in a first direction y. A pair of leading lines 4, 4 are respectively drawn from the end of the corresponding wire 3, and extend in a second direction x. The second direction x crosses the first direction y. In this case, the first direction y and the second direction x are substantially perpendicular to each other.

The dummy area RD is a rectangular area located between the pair of leading lines 4, 4 and located at the side of the wire 3. The pair of pads 5, 5 is provided between the pair of leading lines 4 at the side of the second direction x with respect to the dummy area RD, and are respectively connected to the corresponding leading line 4.

Multiple wires 3 are line-and-space patterns of a certain pitch. The ratio of the wire width w1 and the first interval (wire interval) s1 is not limited. For example, the ratio may be set as 1:1. For example, these wires 3 may be word lines of a NAND memory, or may be gate electrodes of a logic circuit and the like.

(Lithography Process)

Figure 2:
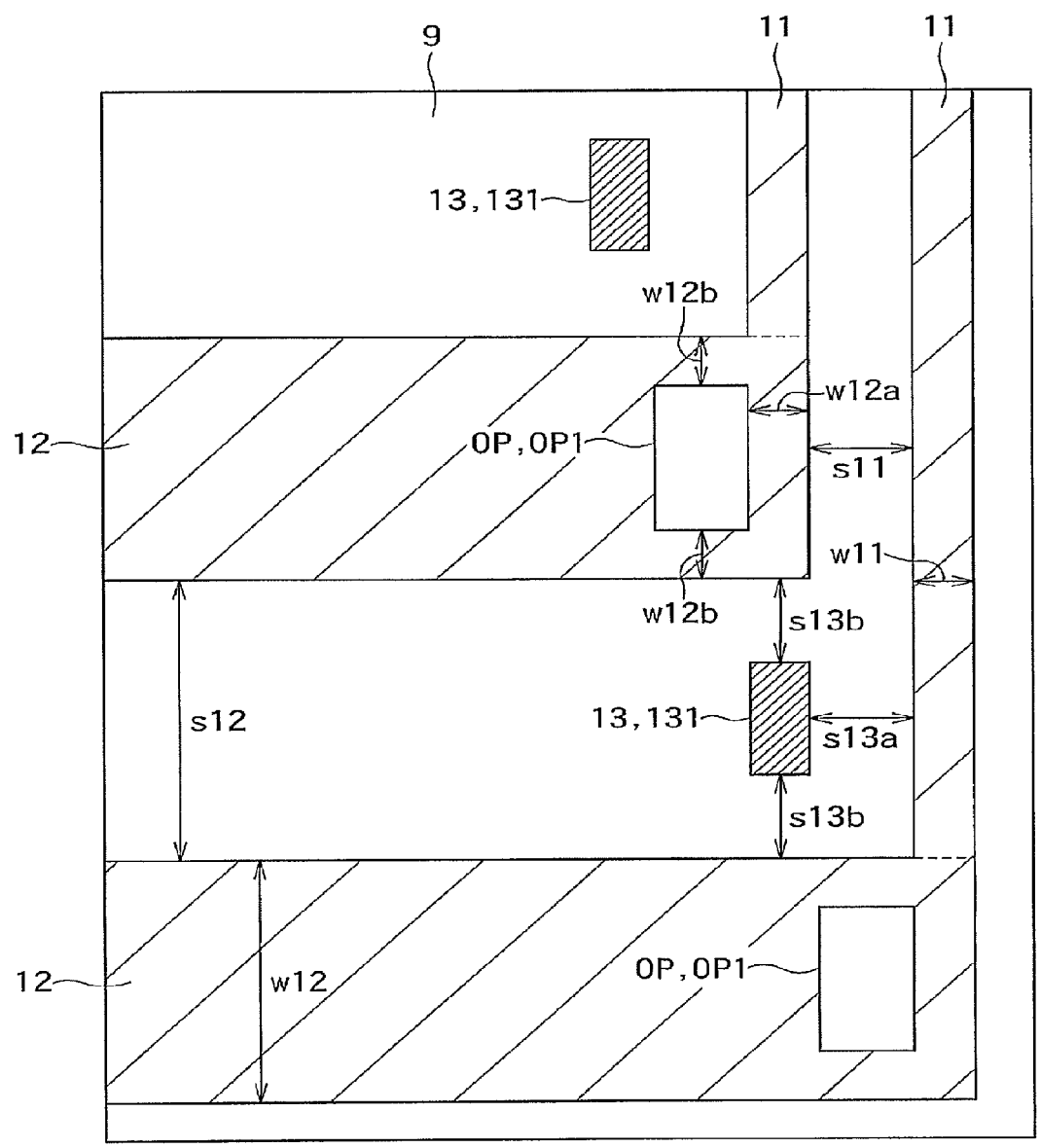
FIG. 2 is a top view for explaining the manufacturing step for manufacturing the semiconductor device following FIG. 1.

After the shape of the wire pattern 2 is determined, a film 9 which is to be processed and which becomes a wire pattern 2 is formed on a foundation layer as shown in FIG. 2. The foundation layer may be a semiconductor substrate, and may be an insulating layer formed on the semiconductor substrate. The foundation layer is not particularly limited. The material of the film 9 to be processed may be, for example, polycrystalline silicon or metal.

Subsequently, a core material is deposited on the film 9 to be processed by, for example, a method such as CVD. The material of the core material is, for example, a silicon oxide film.

Subsequently, lithography and etching are performed using the resist layer having the pattern based on the wire pattern 2 of FIG. 1 as a mask, so that the core material is patterned.

Therefore, as shown in FIG. 2, multiple first core material patterns 11 extending in parallel with the first direction y and multiple second core material patterns 12 extending in parallel with the second direction x, each of the second core material patterns 12 being drawn from an end portion of the corresponding first core material pattern 11, are formed on the film 9 to be processed. The first core material pattern 11 and the corresponding second core material pattern 12 are integrally formed.

The positions in the first direction y of the end portions of the first core material patterns 11 are different from each other. The width w11 of the first core material pattern is determined in accordance with a first interval s1 and the wire width w1 of the wire 3 formed ultimately. The width w12 of the second core material pattern is wider than the width w11 of the first core material pattern and is determined in accordance with the width of the pad 5 ultimately formed.

The first core material patterns 11 are arranged in parallel with a predetermined interval s11. The interval s11 is determined in accordance with the first interval s1 and the wire width w1 of the wire 3 ultimately formed. The second core material patterns 12 are arranged in parallel with an interval s12 wider than the interval s11. The interval s12 is determined in accordance with the width of the pad 5 ultimately formed and the like.

An opening pattern OP or the dummy core material pattern 13 is formed at the position corresponding to the dummy area RD of FIG. 1.

More specifically, the opening pattern OP having a single opening OP1 is formed in the second core material pattern 12 so that a first distance (a remaining width) w12a and a second distance (a remaining width) w12b are less than 100 nm (predetermined distance). The first distance w12a is a distance between an edge of the second core material pattern 12 at the side of the adjacent first core material pattern 11 and the opening pattern OP. The second distance w12b is a distance between an edge of the second core material pattern 12 at the side of the adjacent second core material pattern 12 and the opening pattern OP. The first distance w12a and the second distance w12b may be the same, or may be different from each other.

The width of the opening OP1 in the second direction x is determined in accordance with the length L in the second direction x of the dummy area RD of FIG. 1.

A dummy core material pattern 13 having a single dummy core material 131 is formed on the film 9 to be processed between the adjacent second core material patterns 12, 12 so that an interval s13a from the dummy core material pattern 13 to the adjacent first core material pattern 11 and an interval s13b from the dummy core material pattern 13 to the adjacent second core material pattern 12 are less than 100 nm. The interval s13a and the interval s13b may be the same, or may be different from each other.

The width of the dummy core material pattern 13 in the second direction x is determined in accordance with the length L of the dummy area RD of FIG. 1.

In this case, the opening OP1 and the dummy core material 131 are rectangles (rectangular shapes). Each side of the opening OP1 and the dummy core material 131 is in parallel with the first direction y or the second direction x.

The first and second core material patterns 11, 12 and the dummy core material pattern 13 may be formed in the same step, or may be formed in different steps. The first and second core material patterns 11, 12 and the dummy core material pattern 13 may not be necessarily made of the same material, and may be made of different materials. The first and second core material patterns 11, 12 and the opening OP1 may be formed in the same step, or may be formed in different steps.

(First Side Wall Process)

Subsequently, for example, a first side wall material having a high selectivity for the core material is deposited on the entire surface of the film 9 to be processed, including the side walls of the first core material pattern 11, the second core material pattern 12 and the dummy core material 131, by a method such as CVD. An example of first side wall material includes a silicon nitride film.

Then, anisotropic etching is performed on the first side wall material, so that the film 9 to be processed is exposed while the first side wall material is still left on the side walls of the first core material pattern 11 and the second core material pattern 12 and the side wall of the dummy core material 131. Therefore, the first side wall pattern 21 is formed on the external periphery of the first core material pattern 11 and the second core material pattern 12, the external periphery of the dummy core material 131, and the inner periphery of the opening OP1.

Figure 3:
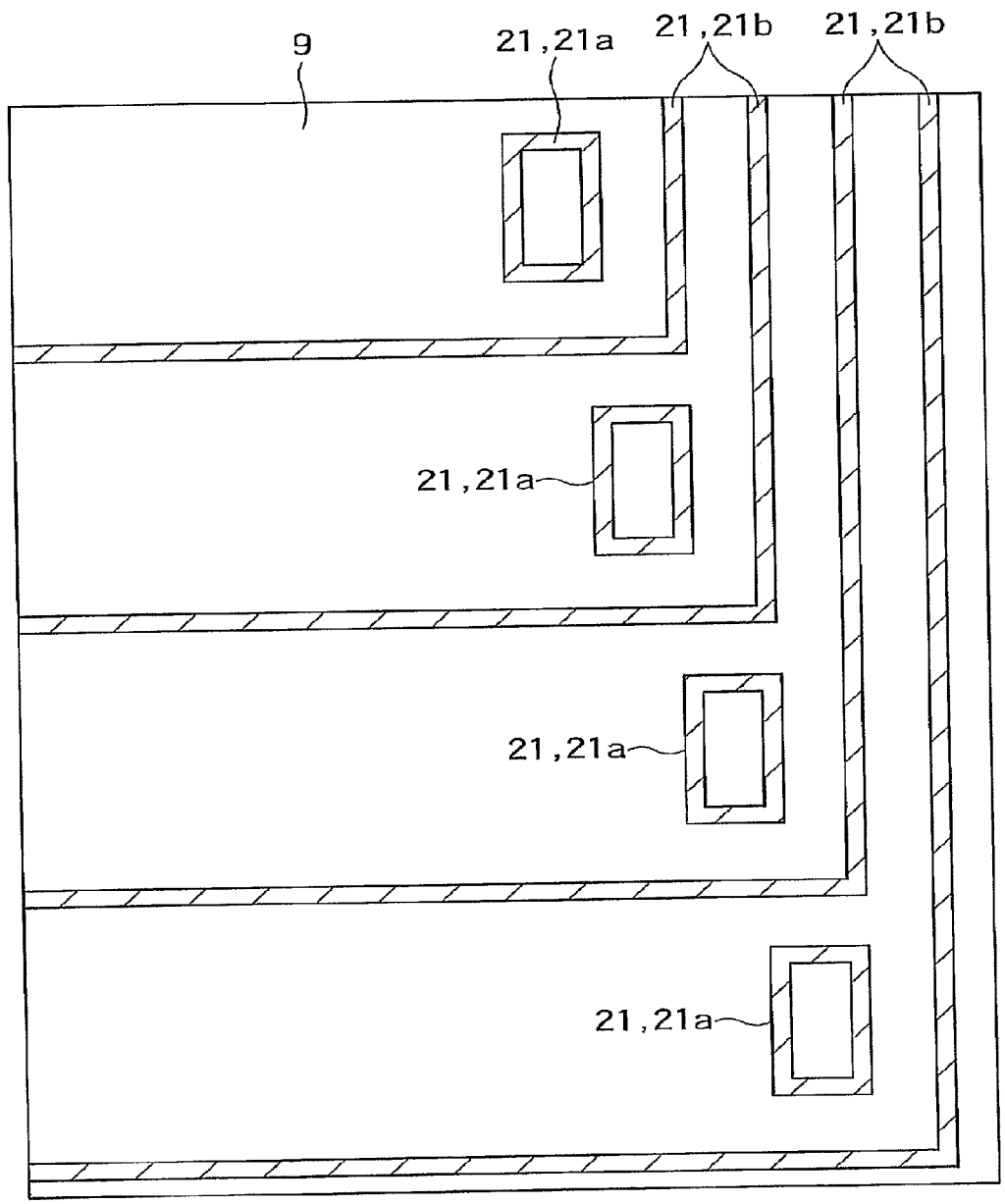
FIG. 3 is a top view for explaining the manufacturing step for manufacturing the semiconductor device following FIG. 2.

After the first side wall pattern 21 is formed, as shown in FIG. 3, the first core material pattern 11, the second core material pattern 12, and the dummy core material pattern 13 are removed, by a method such as wet etching, from the film 9 to be processed while the first side wall pattern 21 is still remaining on the film 9 to be processed.

The first side wall pattern 21 includes a rectangular loop-shaped side wall pattern 21a according to the shape of the opening OP1 or the dummy core material pattern 13, and an L-shaped side wall pattern 21b according to the shapes of the first and second core material patterns 11, 12.

(Second Side Wall Process)

Subsequently, a second side wall material having a high selectivity for the first side wall material is deposited on the entire surface of the film 9 to be processed which includes the side wall of the first side wall pattern 21. An example of second side wall material includes a silicon nitride film.

Then, anisotropic etching is performed on the second side wall material by RIE (Reactive Ion Etching) and the like, so that the film 9 to be processed is exposed while the second side wall material is still left on the side wall of the first side wall pattern 21. Therefore, the second side wall pattern 31 is formed along the external periphery of the first side wall pattern 21.

Figure 4:
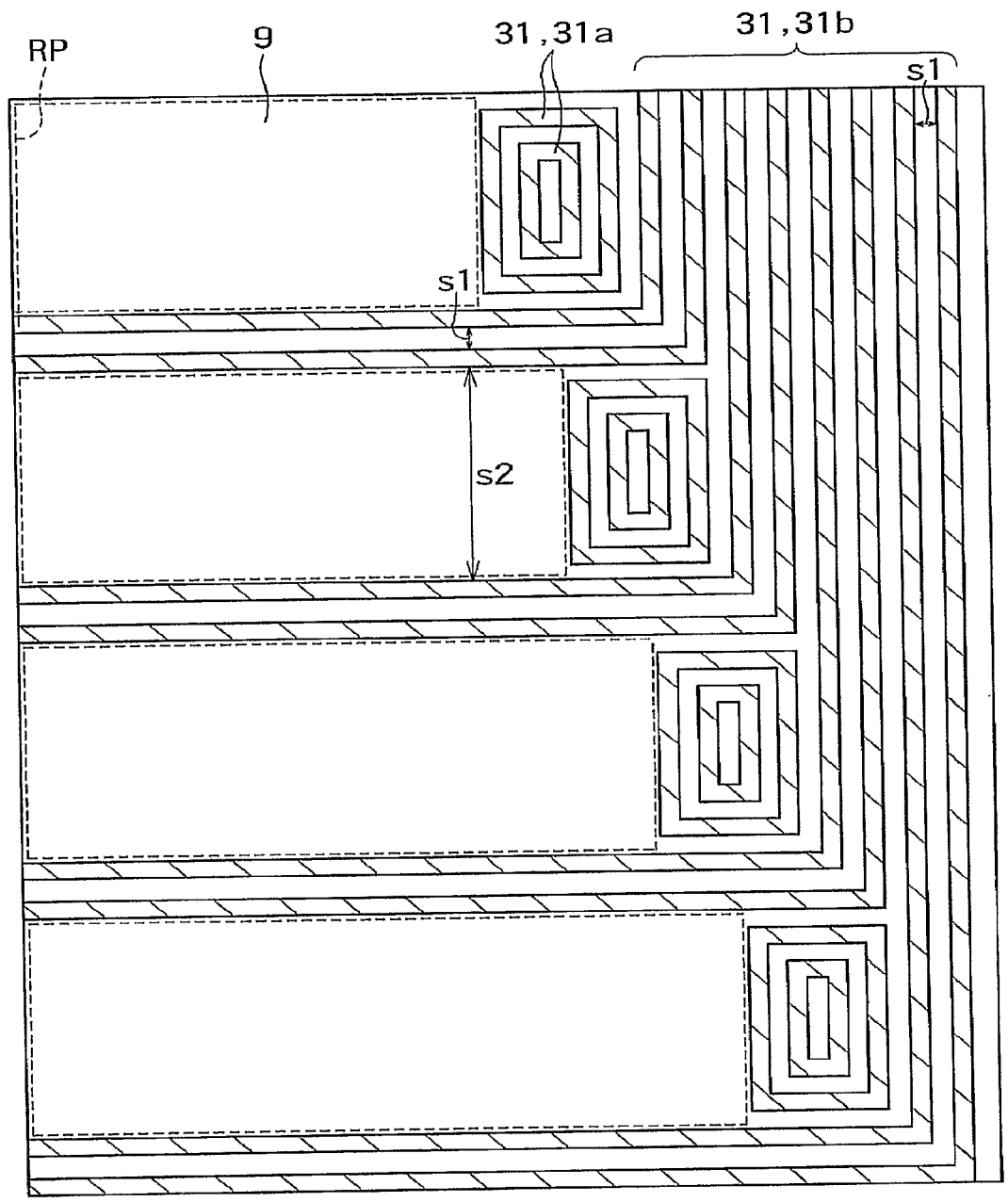
FIG. 4 is a top view for explaining the manufacturing step for manufacturing the semiconductor device following FIG. 3.

After the second side wall pattern 31 is formed, as shown in FIG. 4, the first side wall pattern 21 is removed by a method such as wet etching from the film 9 to be processed, while the second side wall pattern 31 is still left on the film 9 to be processed.

The second side wall pattern 31 includes a rectangular double loop-shaped second side wall pattern 31a according to the shape of the side wall pattern 21a, and an L-shaped side wall pattern 31b according to the shape of the side wall pattern 21b.

The adjacent side wall patterns 31b, 31b are spaced apart by a first interval s1 in a portion where they extend in the first direction y. The adjacent side wall pattern 31b, 31b are spaced apart by the first interval s1 or a second interval s2, which is more than the first interval s1, in a portion where they extend in the second direction x. The first interval s1 is less than 100 nm, and the second interval s2 is equal to or more than 100 nm.

(Etching Process)

After the first side wall pattern 21 is removed, the film 9 to be processed is anisotropically etched by RIE and the like using the second side wall pattern 31 as the mask. More specifically, the film 9 to be processed is anisotropically etched using the second side wall pattern 32 as the mask so that, by making use of loading effect, the etching speed in an area where the interval between the adjacent second side wall patterns 31 is less than 100 nm is faster than the etching speed in the pad area RP where the interval between the adjacent second side wall patterns 31 is equal to or more than 100 nm.

An example of gas used for etching includes chlorine gas ($Cl_2$).

Under such condition, products generated by ions and the like which are incident on the pad area RP during etching are likely to reattach to the pad area RP. Therefore, the etching speed in the pad area RP is slower than the etching speed in an area other than the pad area RP.

Figure 5:
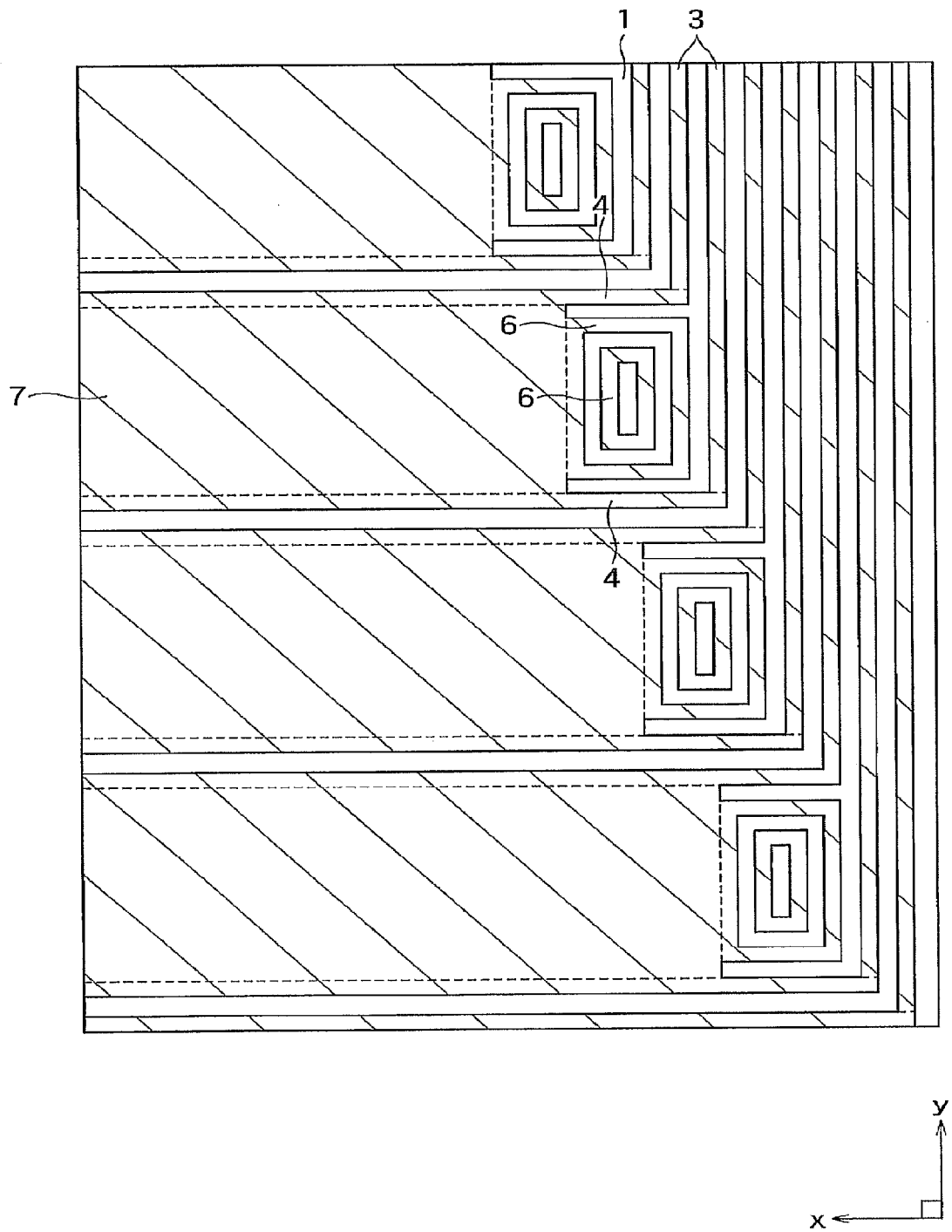
FIG. 5 is a top view for explaining the manufacturing step for manufacturing the semiconductor device following FIG. 4.

Therefore, as shown in FIG. 5, the side wall pattern 31b is transferred, and the wires 3 and the leading lines 4 are formed. The side wall pattern 31a is transferred, and the dummy patterns 6 of the film 9 to be processed is formed at positions corresponding to the opening OP1 or the dummy core material 131. In addition, the pad pattern 7 of the film 9 to be processed is formed between the adjacent second side wall patterns 31, 31 (side wall patterns 31b, 31b) extending in the second direction x which determine the pad area RP. More specifically, in the pad area RP, the second side wall pattern 31 serving as the mask is not provided, but the film 9 to be processed is left there.

The pair of wires 3, 3, the pair of leading lines 4, 4, a portion of the dummy pattern 6, and the pad pattern 7 are integrally formed.

(Cut Process)

Subsequently, the pad pattern 7 and the dummy pattern 6 are cut along the second direction x by using photolithography technique and etching technique.

Figure 6:
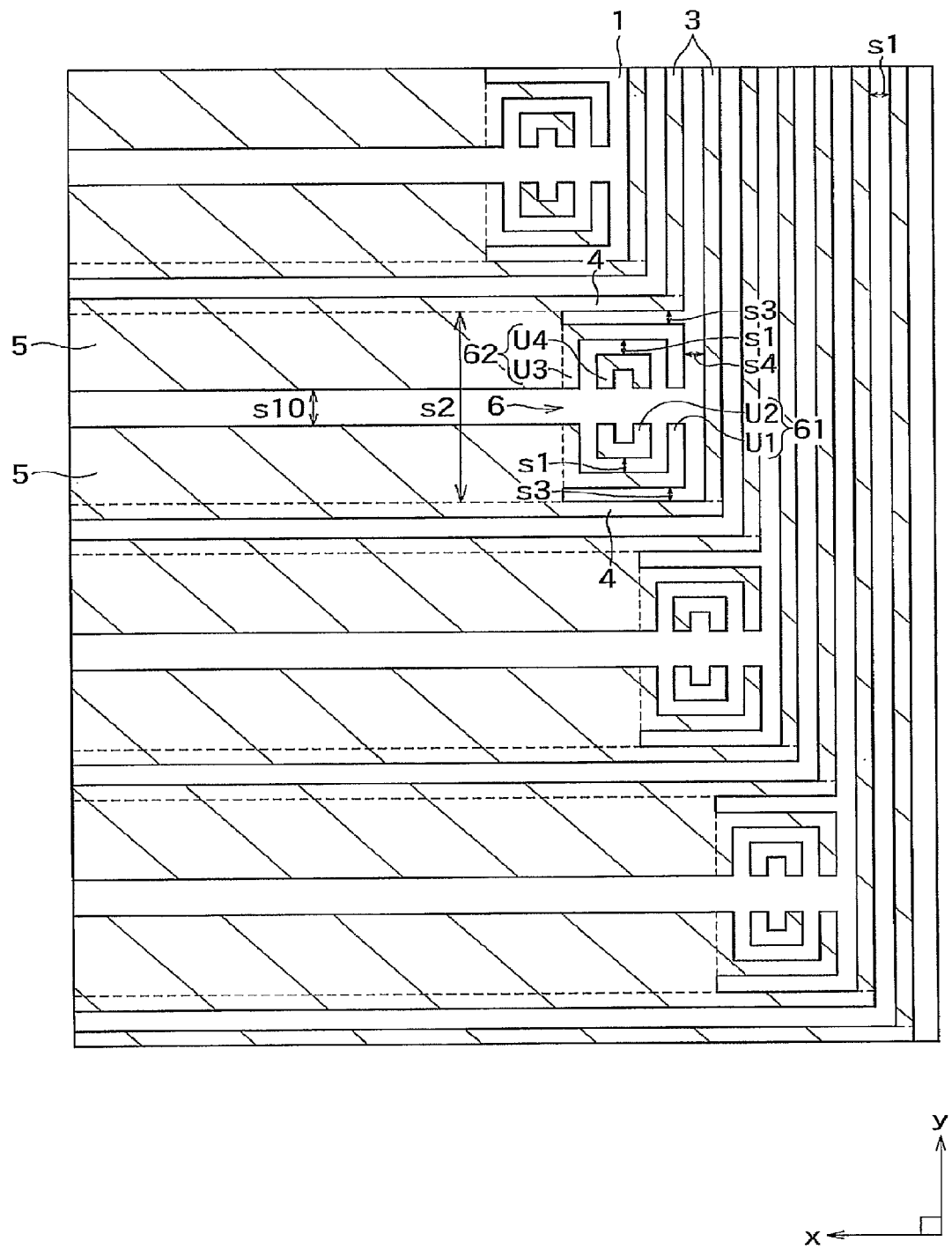
FIG. 6 is a top view for explaining the manufacturing step for manufacturing the semiconductor device following FIG. 5.

As a result, as shown in FIG. 6, the pads 5 are formed. As long as the pad pattern 7 and the dummy pattern 6 can be divided into two, the cut direction may be inclined with respect to the second direction x.

As shown in FIG. 6, in a semiconductor device ultimately formed according to such manufacturing method, the pair of wires 3, 3 are spaced apart by the first interval s1 and extend in the first direction y.

The pair of leading lines 4, 4 are respectively drawn from the end of the corresponding wire 3, and are spaced apart by the second interval s2 and extend in the second direction x.

The dummy pattern 6 is provided between the pair of leading lines 4, 4. The interval s3 between the dummy pattern 6 and the leading line 4 and the interval s4 between the dummy pattern 6 and the wire 3 are less than 100 nm. The interval s3 may be different from the interval s4. The intervals s3, s4 may be the same as the first interval s1.

The pair of pads 5, 5 are provided between the pair of leading lines 4 at the side of the second direction x with respect to the dummy pattern 6, and are respectively connected to the corresponding leading line 4. The interval s10 between the pair of pads 5, 5 is wider than the first interval s1.

The dummy pattern 6 includes the first dummy pattern 61 and the second dummy pattern 62 which are arranged in the first direction y and are separated from each other. The first dummy pattern 61 is connected to one of the pair of pads 5 in the second direction x. The second dummy pattern 62 is connected to the other of the pair of pads 5 in the second direction x.

The first dummy pattern 61 includes a first U-shaped pattern U1 open in the first direction y, and a second U-shaped pattern U2 open in the first direction y, and provided at the inner side of the first U-shaped pattern U1.

The second dummy pattern 62 includes a third U-shaped pattern U3, an opening of the third U-shaped pattern U3 facing an opening of the first U-shaped pattern U1, and a fourth U-shaped pattern U4 provided at the inner side of the third U-shaped pattern U3, an opening of the fourth U-shaped pattern U4 facing an opening of the second U-shaped pattern U2.

Each of the first, second, third and fourth U-shaped patterns U1 to U4 includes a linear pattern extending in the second direction x, and linear patterns connected to both ends of the linear pattern and extending in the first direction y.

The interval between the first U-shaped pattern U1 and the second U-shaped pattern U2 and the interval between the third U-shaped pattern U3 and the fourth U-shaped pattern U4 are the first interval s1.

As explained above, according to the present embodiment, the opening OP1 is formed in the second core material pattern 12, and the dummy core material 131 is formed between the second core material patterns 12, 12, and the second side wall pattern 31 is formed by side wall transfer process on the basis of such pattern. Therefore, with the etching of the film 9 to be processed using the second side wall pattern 31 as the mask, the loop-shaped dummy pattern 6 is formed at the position corresponding to the opening OP1 or the dummy core material 131. Spaces are formed between the dummy pattern 6 and the wire 3 and between the dummy pattern 6 and the leading line 4 in accordance with the first and second distances w12a, w12b of the second core material pattern 12 and the interval s13a between the dummy core material 131 and the first core material pattern 11. Therefore, because of the existence of the spaces, the pad pattern 7 and the dummy pattern 6 can be easily cut along the second direction x without cutting the adjacent wire 3.

Therefore, the pad 5 wider than the wire 3 can be formed without using any cover process that requires a high degree of precision in positioning. For this reason, the manufacturing process can be simplified, and the cost of the semiconductor device can be reduced.

In the above explanation, for example, the predetermined distance is 100 nm, but the embodiment is not limited thereto. As long as the film 9 to be processed can be etched so that the etching speed in the area where the interval between adjacent patterns on the film 9 to be processed is less than the predetermined distance is faster than the etching speed in the area where the interval between adjacent patterns is equal to or more than the predetermined distance, the predetermined distance may be a value other than 100 nm.

The shapes of the opening OP1 and the dummy core material 131 may not be rectangular. For example, with regard to the opening OP1, as long as the first and second distances w12a, w12b are less than 100 nm, the edge of the opening OP1 may be a curved line, or the opening OP1 may be a polygonal shape having five or more vertexes. This is also applicable to the dummy core material 131.

The number of repetition of the side wall transfer process may be set as necessary in accordance with the required wire width w1 and the first interval (wire interval) s1. The number of repetition of the side wall transfer process may be once or three or more times.

Second Embodiment

The second embodiment is different from the first embodiment in that dummy patters arranged in the second direction x are formed. Hereinafter, the difference from the first embodiment will be mainly explained.

Figure 7:
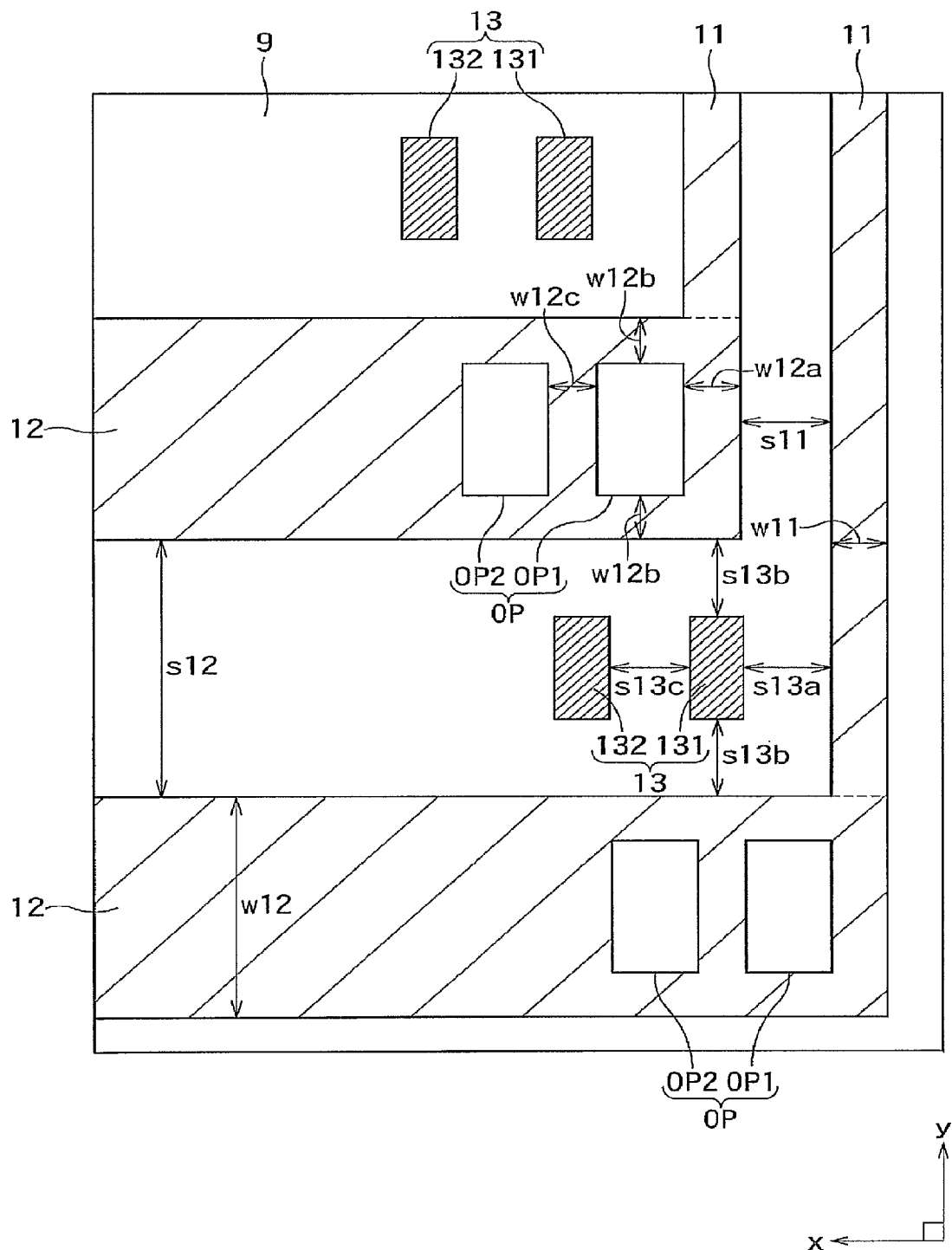
FIG. 7 is a top view for explaining a manufacturing step of a semiconductor device according to a second embodiment.
Figure 8:
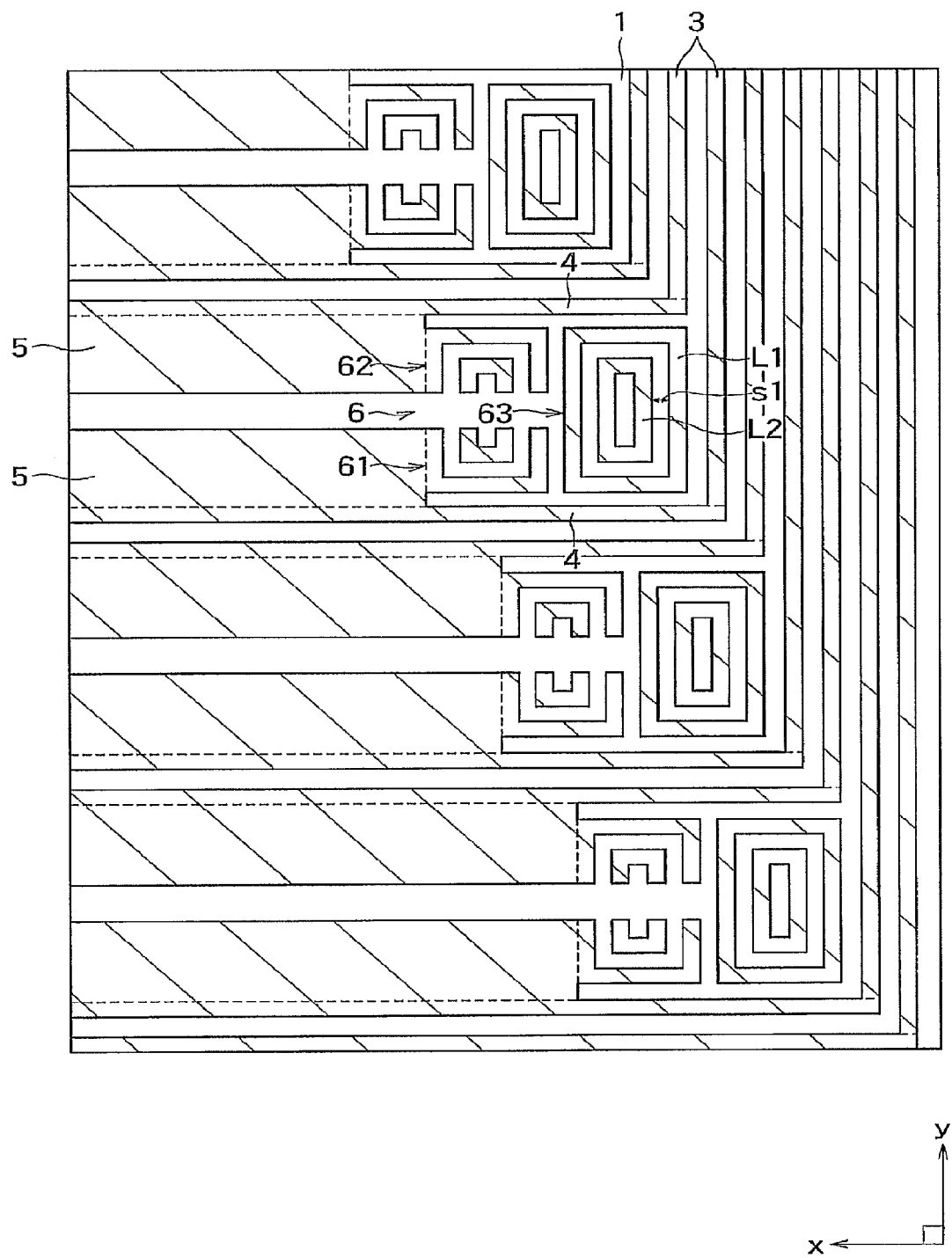
FIG. 8 is a top view for explaining the manufacturing step of the semiconductor device according to the second embodiment.

FIGS. 7 and 8 are top views for explaining manufacturing steps of a semiconductor device according to the second embodiment.

FIG. 7 shows first and second core material patterns 11, 12 and a dummy core material pattern 13 formed by lithography process, and FIG. 7 corresponds to FIG. 2.

As shown in FIG. 7, the opening pattern OP includes two openings OP1, OP2 arranged in the second direction x. The width w12c of the second core material pattern 12 between the openings OP1, OP2 is less than 100 nm.

The dummy core material pattern 13 has two dummy core materials 131, 132 arranged in the second direction x. The interval s13c between the dummy core materials 131, 132 is less than 100 nm.

The width of each of the openings OP1, OP2 and the dummy core materials 131, 132 in the second direction x is determined in accordance with the length L of the dummy area RD of FIG. 1.

Like the first embodiment, the first side wall process, the second side wall process, and the etching process are performed in order on the basis of the first and second core material patterns 11, 12 and the dummy core material pattern 13.

With etching, rectangular double loop-shaped dummy patterns are formed at the positions corresponding to the openings OP1, OP2 and the positions corresponding to the dummy core materials 131, 132.

Thereafter, in the cut process, the pad pattern and the dummy pattern formed at the position corresponding to the opening OP2 or the dummy core material 132 at the side of the pad pattern are cut along the second direction x.

Therefore, the wire pattern of FIG. 8 is obtained. As shown in FIG. 8, the dummy pattern 6 includes not only a first dummy pattern 61 and a second dummy pattern 62 but also a third dummy pattern 63. The third dummy pattern 63 is provided between the first dummy pattern 61 and the adjacent wire 3, and between the second dummy pattern 62 and the adjacent wire 3.

The third dummy pattern 63 includes a rectangular loop-shaped first loop pattern L1, and a rectangular loop-shaped second loop pattern L2 provided at the inner side of the first loop pattern L1. The interval between the first loop pattern L1 and the second loop pattern L2 is a first interval s1.

In the present embodiment, not only the dummy pattern at the side of the pad pattern but also at least a part of the third dummy pattern 63 may also be cut in the cut process. More specifically, the precision of the cut position at the side of the wire 3 can be lower than that of the first embodiment. In this case, for example, the wire pattern of FIG. 9 can be obtained.

Figure 9:
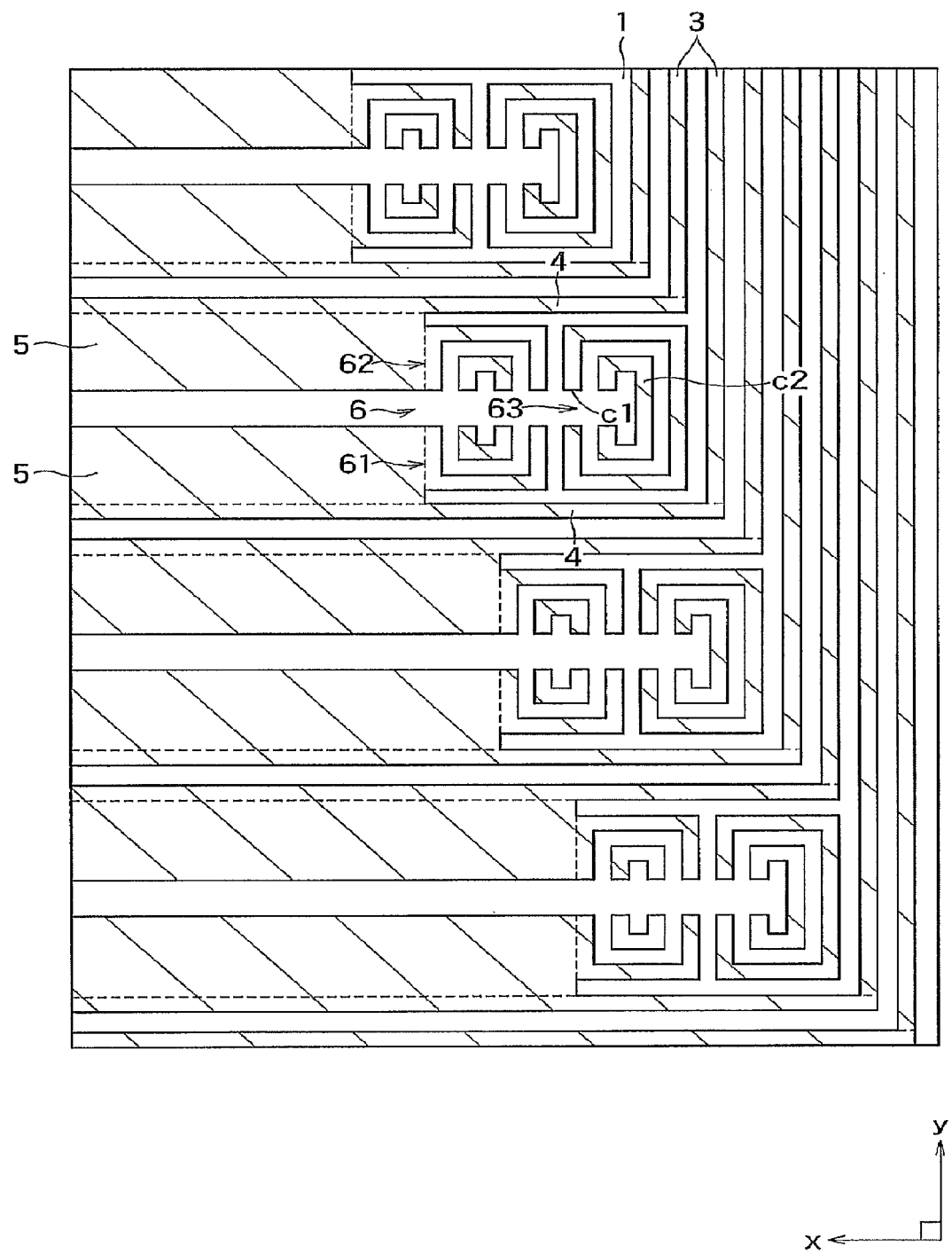
FIG. 9 is a top view of a semiconductor device according to a modification of the second embodiment.

FIG. 9 is a top view of a semiconductor device according to a modification of the second embodiment. As shown in FIG. 9, the third dummy pattern 63 includes a first C-shaped pattern C1 in a C shape which is open in the second direction x, and a second C-shaped pattern C2 which is provided at the inner side of the first C-shaped pattern C1 and which is in a C shape open in the second direction x.

The shape of the third dummy pattern 63 is not limited to the example of FIG. 9, but is determined in accordance with the cut position at the side of the wire 3. For example, when the cut position is closer to the pad 5 than the example of FIG. 9, a loop pattern is formed instead of the second C-shaped pattern C2. For example, when the cut position is closer to the wire 3 than the example of FIG. 9, two U-shaped patterns are formed instead of the second C-shaped pattern C2.

As explained above, according to the second embodiment, two dummy patterns arranged in the second direction x are formed by etching, and therefore, the precision of the cut position at the side of the wire 3 can be lower than that of the first embodiment. Therefore, the dummy pattern at the side of the pad pattern can be cut in an easier and more reliable manner than the first embodiment. For this reason, the manufacturing process can be simplified, and the reliability can be improved.

The number of the openings OP1, OP2 and the dummy core materials 131, 132 in the second direction x is not limited to two, and may be three or more in accordance with the length L of the dummy area RD of FIG. 1. More specifically, in the wire pattern, two or more third dummy patterns 63 are provided between the first dummy pattern 61 and the adjacent wire 3, and between the second dummy pattern 62 and the adjacent wire 3. In this case, in the cut process, two or more third dummy patterns 63 may be cut.

Third Embodiment

The third embodiment is different from the first embodiment in that dummy patterns arranged in the first direction y are formed. Hereinafter, the difference from the first embodiment will be mainly explained.

Figure 10:
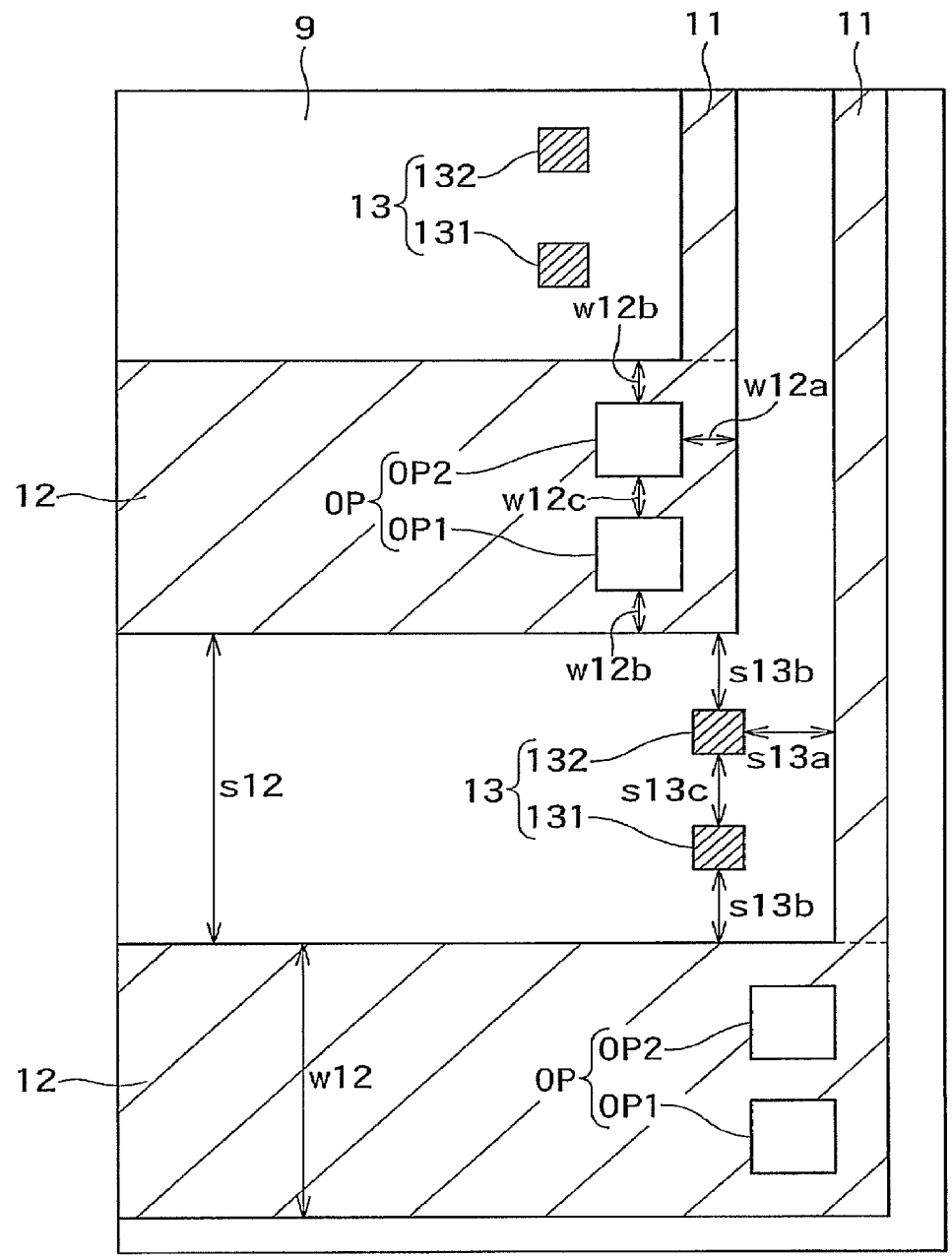
FIG. 10 is a top view for explaining a manufacturing step for manufacturing a semiconductor device according to a third embodiment.
Figure 11:
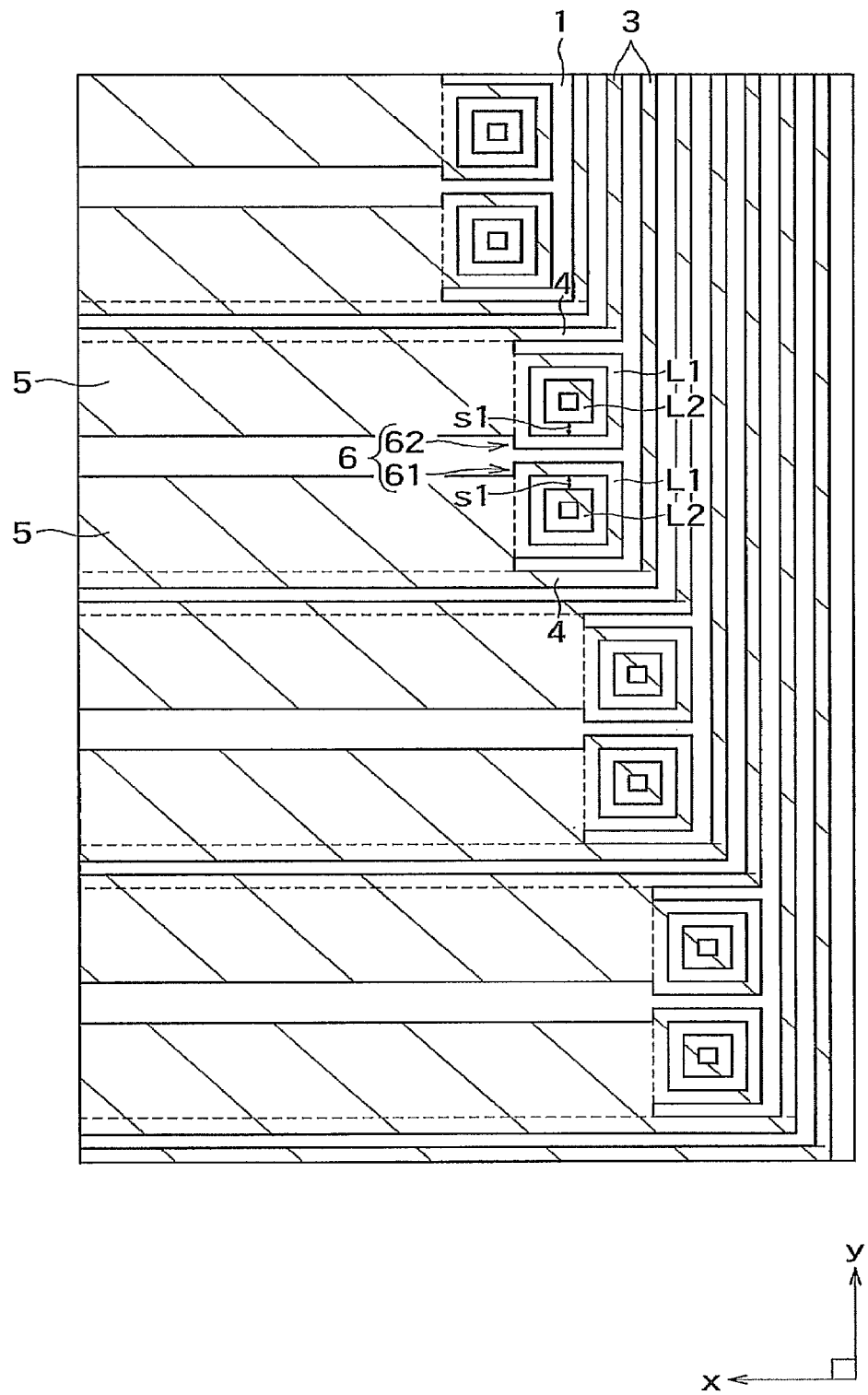
FIG. 11 is a top view for explaining the manufacturing step for manufacturing the semiconductor device according to the third embodiment.

FIGS. 10 and 11 are top view for explaining manufacturing steps for manufacturing a semiconductor device according to the third embodiment.

FIG. 10 shows first and second core material patterns 11, 12 and a dummy core material pattern 13 formed by lithography process, and FIG. 10 corresponds to FIG. 2.

As shown in FIG. 10, the opening pattern OP includes two openings OP1, OP2 which are arranged in the first direction y. The width w12c of the second core material pattern 12 between the openings OP1, OP2 is less than 100 nm.

The dummy core material pattern 13 has two dummy core materials 131, 132 arranged in the first direction y. The interval s13c between the dummy core materials 131, 132 is less than 100 nm.

The width of each of the openings OP1, OP2 and the dummy core materials 131, 132 in the second direction x is determined in accordance with the length L of the dummy area RD of FIG. 1.

Like the first embodiment, the first side wall process, the second side wall process, and the etching process are performed in order on the basis of the first and second core material patterns 11, 12 and the dummy core material pattern 13.

With etching, rectangular double loop-shaped dummy patterns are formed at the positions corresponding to the openings OP1, OP2 and the positions corresponding to the dummy core materials 131, 132.

Thereafter, in the cut process, the pad patterns are cut along the second direction x. Therefore, the wire pattern of FIG. 11 is obtained.

As shown in FIG. 11, each of the first dummy pattern 61 and the second dummy pattern 62 includes a loop-shaped first loop pattern L1, and a loop-shaped second loop pattern L2 provided at the inner side of the first loop pattern L1. The interval between the first loop pattern L1 and the second loop pattern L2 is the first interval s1.

As described above, the present embodiment is different from the first embodiment in that the first dummy pattern 61 and the second dummy pattern 62 arranged in the first direction y and separated from each other are formed by etching, and therefore, it is not necessary to cut the first dummy pattern 61 and the second dummy pattern 62.

Not only the pad pattern but also at least a portion of the first and second dummy patterns 61, 62 may be cut. More specifically, the precision of the cut position at the side of the wire 3 can be lower than that of the first embodiment. In this case, for example, the wire pattern of FIG. 12 can be obtained.

Figure 12:
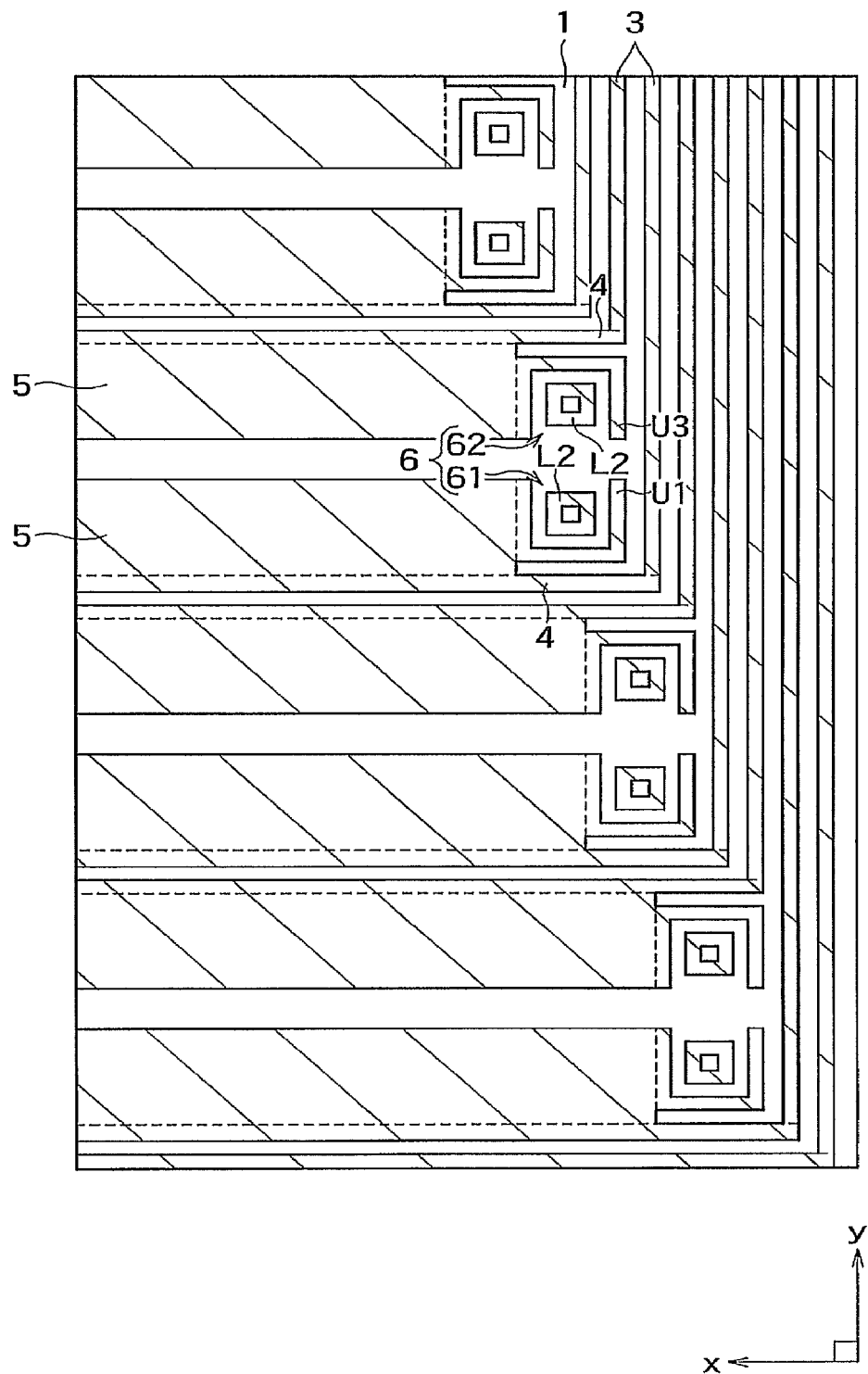
FIG. 12 is a top view illustrating a semiconductor device according to a modification of the third embodiment.

FIG. 12 is a top view illustrating a semiconductor device according to a modification of the third embodiment. As shown in FIG. 12, instead of the first loop pattern L1 of FIG. 11, the first dummy pattern 61 includes a first U-shaped pattern U1 open in the first direction y.

Instead of the first loop pattern L1 of FIG. 11, the second dummy pattern 62 includes a third U-shaped pattern U3, the opening of the third U-shaped pattern U3 facing the opening of the first U-shaped pattern U1.

As explained above, according to the third embodiment, the two dummy patterns arranged in the first direction y are formed by etching, and therefore, the dummy pattern may not be cut, or at least a portion of the dummy pattern may be cut. Therefore, the precision of the cut position at the side of the wire 3 can be lower than that of the first embodiment. Therefore, the pad pattern can be cut in an easier and more reliable manner than the first embodiment. For this reason, the manufacturing process can be simplified, and the reliability can be improved.

It should be noted that the number of the openings OP1, OP2 and the dummy core materials 131, 132 in the first direction y is not limited to two, and may be three or more.

Fourth Embodiment

The fourth embodiment is different from the first embodiment in that dummy patterns arranged in a matrix form are formed. Hereinafter, the difference from the first embodiment will be mainly explained.

Figure 13:
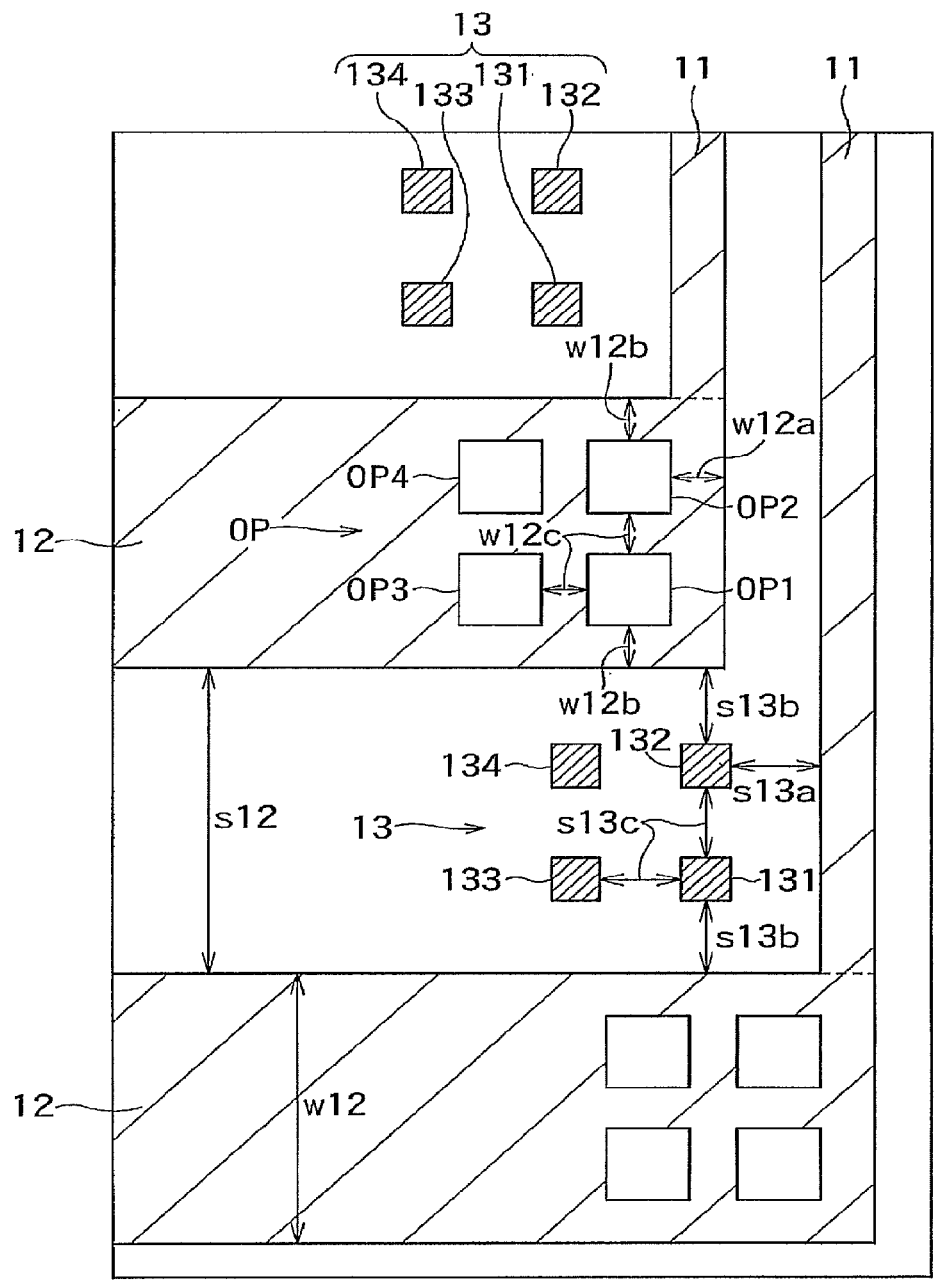
FIG. 13 is a top view for explaining a manufacturing step for manufacturing a semiconductor device according to a fourth embodiment.
Figure 14:
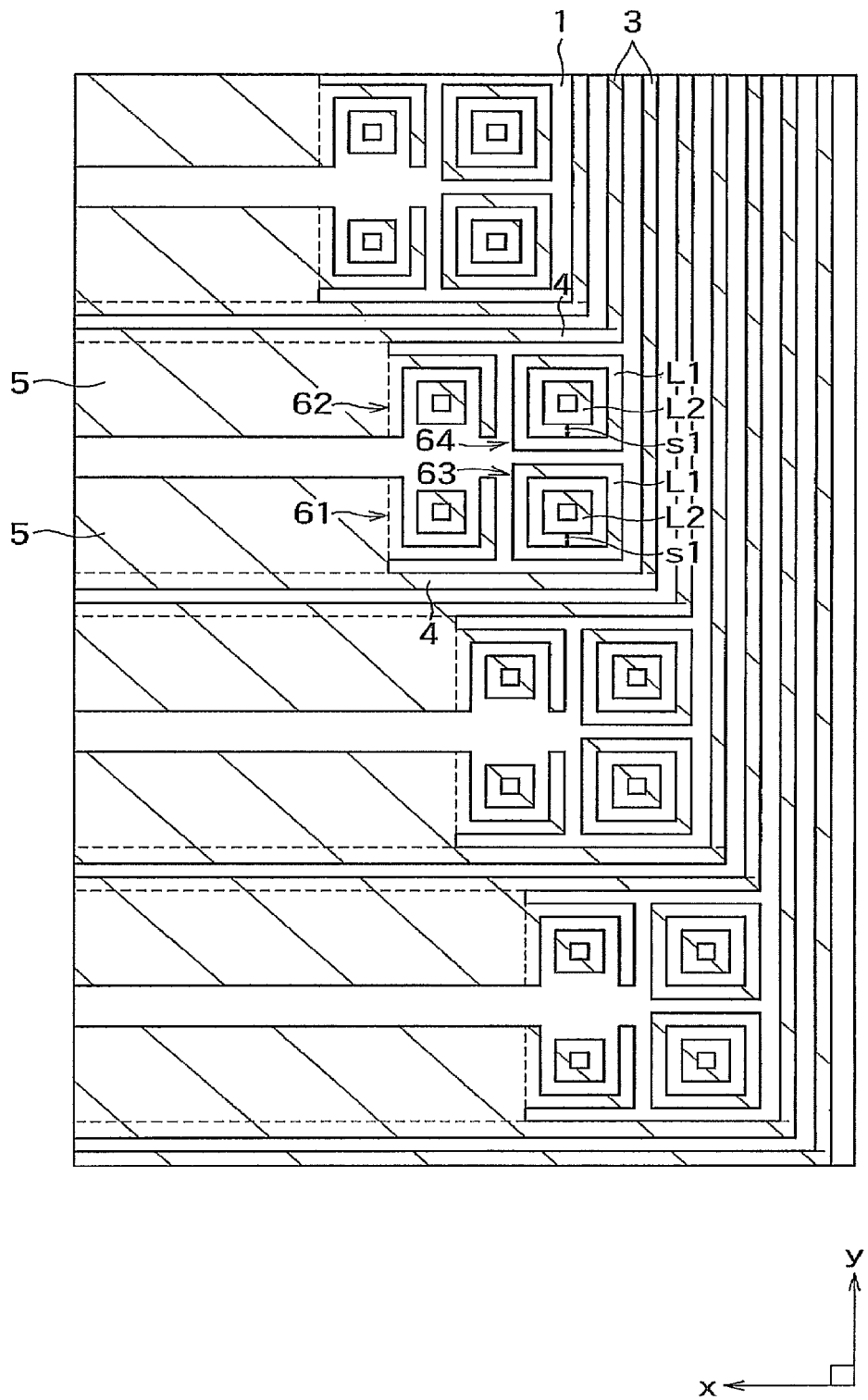
FIG. 14 is a top view for explaining the manufacturing step for manufacturing the semiconductor device according to the fourth embodiment.

FIGS. 13 and 14 are top view for explaining manufacturing steps for manufacturing a semiconductor device according to the fourth embodiment.

FIG. 13 shows first and second core material patterns 11, 12 and a dummy core material pattern 13 formed by lithography process, and FIG. 13 corresponds to FIG. 2.

As shown in FIG. 13, the opening pattern OP includes four openings OP1, OP2, OP3, OP4 arranged in a matrix form in the first direction y and the second direction x. The width w12c of the second core material pattern 12 between the adjacent openings OP1 to OP4 is less than 100 nm.

The dummy core material pattern 13 includes four dummy core materials 131, 132, 133, 14 arranged in a matrix form in the first direction y and the second direction x. The interval s13c between the adjacent dummy core materials 131 to 134 is less than 100 nm.

The width of each of the openings OP1 to OP4 and the dummy core materials 131 to 134 in the second direction x is determined in accordance with the length L of the dummy area RD of FIG. 1.

Like the first embodiment, the first side wall process, the second side wall process, and the etching process are performed in order on the basis of the first and second core material patterns 11, 12 and the dummy core material pattern 13.

With etching, rectangular double loop-shaped dummy patterns are formed at the positions corresponding to the openings OP1 to OP4 and the positions corresponding to the dummy core materials 131 to 134.

Thereafter, in the cut process, the pad pattern and the dummy pattern formed by etching at positions corresponding to the two openings OP3, OP4 at the side of the pad pattern or the two dummy core materials 133, 134 are cut along the second direction x.

Therefore, the wire pattern of FIG. 14 is obtained. As shown in FIG. 14, the dummy pattern 6 includes the third dummy pattern 63 provided between the first dummy pattern 61 and the wire 3, and the fourth dummy pattern 64 provided between the second dummy pattern 62 and the wire 3, in addition to the first dummy pattern 61 and the second dummy pattern 62.

Each of the third dummy pattern 63 and the fourth dummy pattern 64 includes a loop-shaped first loop pattern L1 and a loop-shaped second loop pattern L2 provided at the inner side of the first loop pattern L1. The interval between the first loop pattern L1 and the second loop pattern L2 is the first interval s1.

In the cut process, as long as the pad pattern can be cut, the dummy pattern may not be cut.

As explained above, according to the fourth embodiment, four dummy patterns arranged in a matrix form are formed by etching, and therefore, the dummy pattern may not be cut, and at least a portion of the dummy pattern may be cut. Therefore, the precision of the cut position at the side of the wire 3 can be lower than that of the first embodiment. Therefore, the pad pattern can be cut in an easier and more reliable manner than the first embodiment. For this reason, the manufacturing process can be simplified, and the reliability can be improved.

The number of the openings OP1 to OP4 and the dummy core materials 131 to 134 in the second direction x is not limited to two, and may be three or more in accordance with the length L of the dummy area RD of FIG. 1. More specifically, in the wire pattern, two or more third dummy patterns 63 may be provided between the first dummy pattern 61 and the wire 3, and two or more fourth dummy patterns 64 may be provided between the second dummy pattern 62 and the wire 3.

It should be noted that the number of the openings OP1 to OP4 and the dummy core materials 131 to 134 in the first direction y is not limited to two, and may be three or more.

The fourth embodiment may be combined with the first embodiment. More specifically, in the wire pattern, two or more third dummy patterns 63 according to the fourth embodiment may be provided between the first dummy pattern 61 and the wire 3 according to the first embodiment, and two or more fourth dummy patterns 64 according to the fourth embodiment may be provided between the second dummy pattern 62 and the wire 3 according to the first embodiment.

The fourth embodiment may be combined with the second embodiment. More specifically, in the wire pattern, two or more dummy patterns arranged in a matrix form according to the fourth embodiment may be provided between the third dummy pattern 63 and the wire 3 according to the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, comprising:

forming, on a film to be processed, a plurality of first core material patterns extending in parallel in a first direction, and a plurality of second core material patterns, each of the second core material patterns being drawn from an end portion of the corresponding first core material pattern, the second core material patterns extending in parallel in a second direction crossing the first direction, a width of the second core material pattern being wider than a width of the first core material pattern;

forming an opening pattern having one or a plurality of openings in the second core material pattern so that a first distance and a second distance are less than a predetermined distance, the first distance being a distance between an edge of the second core material pattern at a side of an adjacent first core material pattern and the opening pattern, the second distance being a distance between an edge of the second core material pattern at a side of an adjacent second core material pattern and the opening pattern;

forming a first side wall pattern along external peripheries of the first core material pattern and the second core material pattern and along an inner periphery of the opening;

removing the first core material pattern and the second core material pattern after forming the first side wall pattern; and etching the film after removing the first and second core material patterns.

2. The manufacturing method of the semiconductor device according to claim 1, wherein the first core material patterns are arranged in parallel with a predetermined interval, the second core material patterns are arranged in parallel with an interval wider than the predetermined interval, before the first side wall pattern is formed, a dummy core material pattern having one or a plurality of dummy core materials is formed on the film between the adjacent second core material patterns so that an interval to the adjacent first core material pattern and an interval to the adjacent second core material pattern are less than the predetermined distance, the first side wall pattern is formed along external peripheries of the first core material pattern and the second core material pattern, an external periphery of the dummy core material, and an inner periphery of the opening, after the first side wall pattern is formed, the first core material pattern, the second core material pattern, and the dummy core material pattern are removed, and after the first core material pattern, the second core material pattern, and the dummy core material pattern are removed and before the film is etched, a second side wall pattern is formed along an external periphery of the first side wall pattern, and after the second side wall pattern is formed, the first side wall pattern is removed.

3. The manufacturing method of the semiconductor device according to claim 1, wherein the predetermined distance is 100 nm.

4. The manufacturing method of the semiconductor device according to claim 2, wherein a pad pattern of the film, formed by etching between the adjacent second side wall patterns extending in the second direction, and a dummy pattern of the film, formed by etching at a position corresponding to the opening or the dummy core material, are cut.

5. The manufacturing method of the semiconductor device according to claim 2, wherein the opening pattern comprises two openings arranged in the second direction, and a width of the second core material pattern between the openings is less than the predetermined distance, and the dummy core material pattern comprises two dummy core materials arranged in the second direction, and an interval between the dummy core materials is less than the predetermined distance.

6. The manufacturing method of the semiconductor device according to claim 5, wherein a pad pattern of the film, formed by etching between the adjacent second side wall patterns extending in the second direction, and a dummy pattern of the film, formed by etching at a position corresponding to the dummy core material or the opening at the side of the pad pattern, are cut.

7. The manufacturing method of the semiconductor device according to claim 2, wherein the opening pattern comprises two openings arranged in the first direction, and a width of the second core material pattern between the openings is less than the predetermined distance, and the dummy core material pattern comprises two dummy core materials arranged in the first direction, and an interval between the dummy core materials is less than the predetermined distance.

8. The manufacturing method of the semiconductor device according to claim 7, wherein a pad pattern of the film, formed by etching between the adjacent second side wall patterns extending in the second direction, and dummy patterns of the film, formed by etching at positions corresponding to the dummy core materials or the openings, are cut.

9. The manufacturing method of the semiconductor device according to claim 2, wherein the opening pattern comprises four openings arranged in a matrix form in the first direction and the second direction, and a width of the second core material pattern between the adjacent openings is less than the predetermined distance, and the dummy core material pattern comprises four dummy core materials arranged in a matrix form in the first direction and the second direction, and an interval between adjacent dummy core materials is less than the predetermined distance.

10. The manufacturing method of the semiconductor device according to claim 9, wherein a pad pattern of the film, formed by etching between the adjacent second side wall patterns extending in the second direction, and dummy patterns of the film, formed by etching at positions corresponding to the two dummy core material or the two openings at the side of the pad pattern, are cut.

11. The manufacturing method of the semiconductor device according to claim 2, wherein the opening and the dummy core material are in a rectangular shape.

* * * * *